(12) United States Patent
Em

(10) Patent No.: US 11,183,239 B2
(45) Date of Patent: Nov. 23, 2021

(54) RESISTIVE MEMORY DEVICE AND OPERATING METHOD THEREOF

(71) Applicant: SK hynix Inc., Gyeonggi-do (KR)

(72) Inventor: Ho-Seok Em, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 43 days.

(21) Appl. No.: 16/845,847

(22) Filed: Apr. 10, 2020

(65) Prior Publication Data

US 2021/0193223 A1 Jun. 24, 2021

(30) Foreign Application Priority Data

Dec. 23, 2019 (KR) ........................ 10-2019-0173231

(51) Int. Cl.
*G11C 7/22* (2006.01)
*G11C 13/00* (2006.01)
*G11C 7/06* (2006.01)

(52) U.S. Cl.
CPC ............ *G11C 13/0069* (2013.01); *G11C 7/06* (2013.01); *G11C 13/004* (2013.01); *G11C 13/0004* (2013.01); *G11C 13/0026* (2013.01); *G11C 13/0028* (2013.01); *G11C 13/0038* (2013.01)

(58) Field of Classification Search
CPC .............. G11C 13/004; G11C 13/0004; G11C 2013/0076; G11C 2013/0092; G11C 11/5642; G11C 16/10; G11C 11/1673; G11C 11/1655; G11C 11/1677; G11C 11/1693; G11C 7/12; G11C 8/08
See application file for complete search history.

(56) References Cited

U.S. PATENT DOCUMENTS

| | | | |
|---|---|---|---|
| 9,406,359 B2 * | 8/2016 | Park | G11C 7/1045 |
| 9,437,290 B2 * | 9/2016 | Lee | G11C 13/0033 |
| 9,627,056 B2 * | 4/2017 | Park | G11C 13/0061 |
| 2016/0027485 A1 * | 1/2016 | Park | G06F 11/076 |
| | | | 365/191 |

FOREIGN PATENT DOCUMENTS

KR 10-2008-0081656 9/2008
KR 10-0934851 1/2010

* cited by examiner

*Primary Examiner* — Hien N Nguyen
(74) *Attorney, Agent, or Firm* — IP & T Group LLP

(57) ABSTRACT

An operation method of a resistive memory device includes receiving write data and an address; determining whether the write data is in a first state or in a second state; applying a first pulse to a target memory cell corresponding to the address, among a plurality of memory cells, when the write data is in the first state; and selectively applying, when the write data is in the second state, a second pulse to the target memory cell according to a comparison result of the write data and pre-read data which is pre-stored data read from the target memory cell.

21 Claims, 7 Drawing Sheets

FIG. 7

| Case | Write data | Pre-stored data | Prior Art (FIG. 3) | Present embodiment (FIG. 6) |
|---|---|---|---|---|
| CASE 1 | Set | Reset | Write set data (pre-read) | Write set data |
| CASE 2 | Reset | Reset | No operation (pre-read) | No operation (pre-read) |
| CASE 3 | Set | Set | Heat anneal (pre-read) | Write set data |
| CASE 4 | Reset | Set | Write reset data (pre-read) | Write reset data (pre-read) |

RESISTIVE MEMORY DEVICE AND OPERATING METHOD THEREOF

CROSS-REFERENCE TO RELATED APPLICATIONS

This application claims priority under 35 U.S.C. § 119 to Korean Patent Application No. 10-2019-0173231, filed on Dec. 23, 2019, the disclosure of which is incorporated herein by reference in its entirety.

BACKGROUND

1. Field

Various embodiments of the present invention relate to a semiconductor design technique, and more particularly, to a write operation of a resistive memory device.

2. Description of the Related Art

Due to the demands for semiconductor memory devices having high capacity and low-power consumption of, research on next-generation memory devices having non-volatility and not having a refresh have been conducted. The next-generation memory devices include a phase-change random access memory (PRAM) using a phase-change material, a resistive random-access memory (RRAM) using a variable resistance material such as a transition metal oxide, and a magnetic random-access memory (MRAM) using a ferromagnetic material. The resistance of materials consisting of next-generation semiconductor memory elements may be varied in accordance with a voltage or current supplied to the memory devices. Even though the current or voltage supply is interrupted, not only do the materials retain the resistance but a high operating speed is also secured.

Particularly, among such resistive memory devices, a PRAM is applicable to various semiconductor systems and semiconductor memory devices because it is non-volatile and can access data at random.

SUMMARY

Various embodiments of the present invention are directed to a resistive memory device capable of performing a selective write operation according to an operational sequence depending on write data, and an operating method of the resistive memory device.

In accordance with an embodiment of the present invention, an operating method of a resistive memory device may include: receiving write data and an address; determining whether the write data is in a first state or in a second state; applying a first pulse to a target memory cell corresponding to the address, among a plurality of memory cells, when the write data is in the first state; and selectively applying, when the write data is in the second state, a second pulse to the target memory cell according to a comparison result of the write data and pre-read data which is pre-stored data read from the target memory cell.

In accordance with an embodiment of the present invention, a resistive memory device may include: a memory cell array including a plurality of memory cells; and a peripheral circuit suitable for determining whether write data is in a first state or in a second state, applying a first pulse to a target memory cell corresponding to an address, among the memory cells, when the write data is in the first state, and selectively applying, when the write data is in the second state, a second pulse to the target memory cell according to a comparison result of the write data and pre-read data which is pre-stored data read from the target memory cell.

In accordance with an embodiment of the present invention, a memory system may include: a controller suitable for providing write data and an address; and a resistive memory device including a plurality of memory cells and suitable for determining whether the write data is in a first state or in a second state, applying a first pulse to a target memory cell corresponding to the address when the write data is in the first state, and selectively applying, when the write data is in the second state, a second pulse to the target memory cell according to a comparison result of the write data and pre-read data which is pre-stored data read from the target memory cell.

In accordance with an embodiment of the present invention, an operating method of a resistive memory device may include: applying, when the write data is in a set state, a set pulse to a target memory cell; comparing, when the write data is in a reset state, the write data with pre-read data of the target memory cell; and applying a reset pulse to the target memory cell when a result of the comparison indicates that the pre-read data is in the set state.

BRIEF DESCRIPTION OF THE DRAWINGS

FIG. 7 is a comparative table for comparing a conventional selective write operation to a selective write operation in accordance with an embodiment of the present invention.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

In the following description, numerous specific details are set forth in order to provide a thorough understanding of the present invention. However, it is noted, that the present invention may be practiced without some or all these specific details.

In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated. The drawings are not necessarily to scale and, in some instances, proportions may have been exaggerated to clearly illustrate features of the embodiments.

Figure 1:
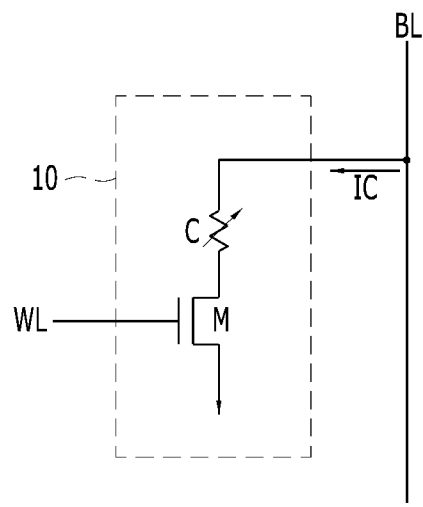
FIG. 1 is a schematic diagram illustrating a memory cell of a resistive memory device.

FIG. 1 is a schematic diagram illustrating a memory cell 10 of a resistive memory device.

Referring to FIG. 1, the memory cell 10 of the resistive memory device may include a variable resistor C and an access transistor M.

The variable resistor C may be coupled to a bit line BL. The access transistor M may be coupled between the variable resistor C and a ground. A gate of the access transistor M may be coupled to a word line WL. When a voltage is applied to the word line WL, the access transistor M may be turned on. When the access transistor M is turned on, the variable resistor C may receive a current IC through the bit line BL.

In an embodiment, the resistive memory device may be composed of a phase-change memory device. For example, the variable resistor C may include a phase-change material such as a chalcogenide alloy changing between a crystalline state and an amorphous state due to a temperature change.

A method using a laser beam and a method using a current are widely known as methods for heating a phase-change material. The method using the current is preferred in terms of ease of implementation of a memory chip. Accordingly, the phase-change memory device may use characteristics of the phase-change material that changes into the crystalline state or the amorphous state according to the current IC supplied through the bit line BL in order to write data.

Figure 2:
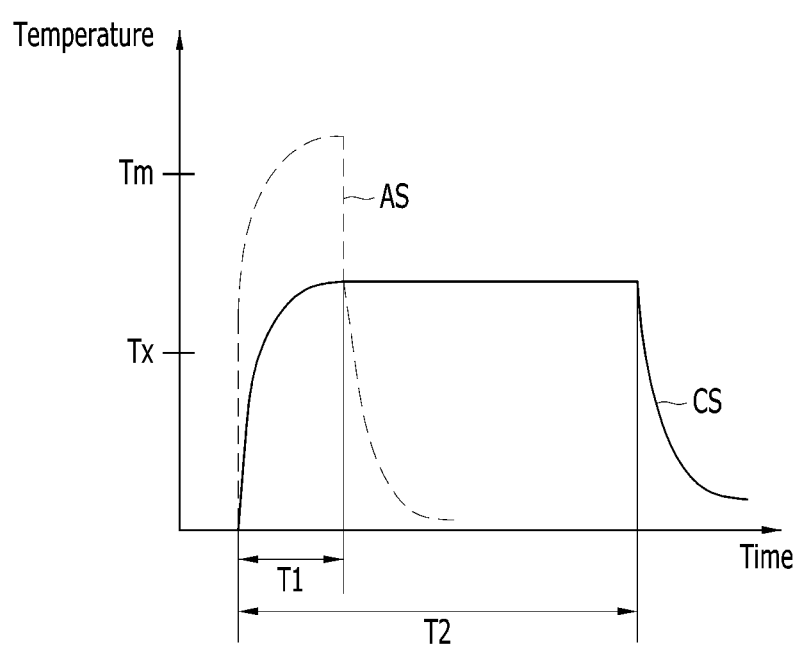
FIG. 2 is a graph for describing characteristics of a phase-change material of a memory cell of a resistive memory device.

FIG. 2 is a graph for describing characteristics of a phase-change material of a memory cell of a resistive memory device, for example, the memory cell 10 of the resistive memory device in FIG. 1.

In FIG. 2, the reference symbol "AS" represents a condition for causing the phase-change material to change into an amorphous state (hereinafter, referred to as a reset pulse AS), and the reference symbol "CS" represents a condition for causing the phase-change material to change into a crystalline state (hereinafter, referred to as a set pulse CS).

Referring to FIG. 2, when the phase-change material is heated to a temperature higher than a melting temperature Tm due to the reset pulse AS supplied through the bit line, and then rapidly quenched during a first time T1, the material becomes the amorphous state. The amorphous state is referred to as a reset state, and data at a logic low level ("0") may be stored in the phase-change material in the amorphous state, i.e., the reset state.

Unlike the above case, when the phase-change material is heated to a temperature that is higher than a crystallization temperature Tc and is lower than the melting temperature Tm due to the set pulse CS supplied through the bit lines, and then slowly quenched during a second time T2 longer than the first time T1 (T2>T1), the material becomes the crystalline state. The crystalline state is referred to as a set state, and data at a logic high level ("1") may be stored in the phase-change material in the crystalline state, i.e., the set state. A resistance of the memory cell is varied with an amorphous volume of the phase-change material. The resistance of the memory cell is the highest in the amorphous state and the lowest in the crystalline state.

A basic operation of the phase-change memory device is described below with reference to FIGS. 1 and 2.

During a write operation of the phase-change memory device, when a voltage is applied to the word line WL, the access transistor M is turned on, and the current IC is supplied to the variable resistor C, i.e., the phase-change material, through the bit line BL. Accordingly, the variable resistor C gets into the crystalline state or the amorphous state.

The write operation includes a reset operation of writing a low data "0" by transitioning a state of the phase-change material into the reset state based on the reset pulse AS and a set operation of writing a high data "1" by transitioning the state of the phase-change material into the set state based on the set pulse CS. Since the resistance of the phase-change material in the amorphous state is relatively higher than in the crystalline state, the reset pulse AS applied during the reset operation has a greater peak current than the set pulse CS applied during the set operation. The set pulse CS applied during the set operation is applied for a longer time than the reset pulse AS applied during the reset operation, thereby having a greater current consumption.

During a read operation of the phase-change memory device, when a voltage is applied to the word line WL, the access transistor M is turned on, and a read pulse is supplied to the variable resistor C, i.e., the phase-change material, through the bit line BL. In this case, a state of the phase-change material, that is, data stored in the phase-change material, is determined based on the amount of current depending on the resistance of the phase-change material.

Generally, the write operation of the phase-change memory device may require a greater amount of current and a longer latency to change the state of the phase-change material, compared to the read operation thereof. On the other hand, the read operation of the phase-change memory device may read values of data by using a smaller amount of current and a shorter latency because it senses just a present state of the phase-change material.

Meanwhile, the phase-change memory device has performed a write operation to write data provided from outside on memory cells, regardless of a value of data pre-stored in the memory cells (hereinafter, referred to as "pre-stored data"). In order to reduce unnecessary power consumption in the write operation, a selective write operation has been proposed to compare the pre-stored data with the write data, and selectively perform the write operation according to a result of the comparison.

Figure 3:
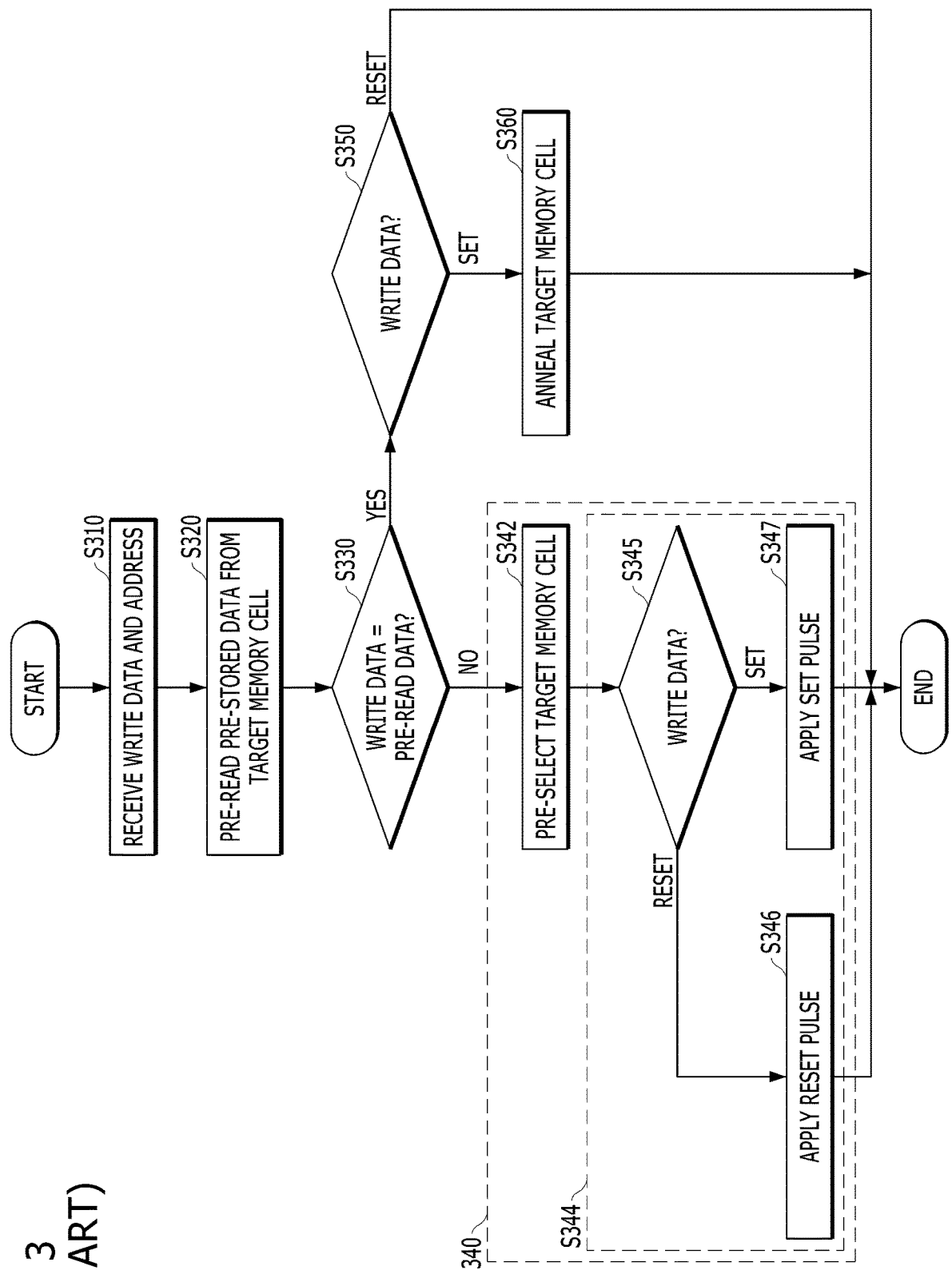
FIG. 3 is a flow chart for describing a selective write operation of a resistive memory device.

FIG. 3 is a flow chart for describing a selective write operation of a resistive memory device.

Referring to FIG. 3, during a write operation, an address for designating a target memory cell, and write data to be written in the target memory cell are provided to the resistive memory device from an external controller or an external test device (at step S310). The resistive memory device reads data pre-stored in the target memory cell corresponding to the address (at step S320). Hereinafter, such a read operation may be referred to as a "pre-read operation" and data acquired through the pre-read operation may be referred to as "pre-read data". The resistive memory device compares the pre-read data to the write data (at step S330). For example, the write data and the pre-read data may be compared bit by bit.

When a result of the comparison indicates that the pre-read data and the write data are different from each other ("NO" at step S330), the resistive memory device writes the write data into the target memory cell (at step S340). In an embodiment, all of the bits in the write data may be written into the target memory cell. In an embodiment, only bits that were different between the pre-read data and the write data after the comparison may be written into the target memory cell. The write operation (at step S340) may include a pre-select operation (at step S342) to apply a bias to a word line and a bit line associated with the target memory cell, and a pulse apply operation (at step S344) to apply set/reset pulses corresponding to the write data to the target memory cell.

The pre-select operation (at step S342) may be an operation that applies a bias to the selected word line and the selected bit line according to the address in order to select the target memory cell located therebetween. During the pre-select operation (at step S342), the resistive memory device may be controlled so that adjacent memory cells located on the same bit line or on the same word line as the target memory cell are not selected, while applying a bias to the selected word line and the selected bit line. For example, the resistive memory device applies a bias to the selected word line and the selected bit line, while applying a ground voltage (VSS) to the remaining non-selected bit lines and non-selected word lines. After that, if the target memory cell is not turned on, the resistive memory device may increase the bias applied to the selected bit line while applying a bias higher than the ground voltage (VSS) to the remaining non-selected word lines, preventing memory cells located on the same bit line from turning on.

During the pulse apply operation (at step S344), the resistive memory device may apply a reset pulse to the target memory cell (at step S346) when the write data is in a reset state (e.g., low data "0") ("RESET" at step S345). The resistive memory device may apply a set pulse to the target memory cell (at step S347) when the write data is in a set state (e.g., high data "1") ("SET" at step S345). Then, the resistive memory device may terminate the write operation.

On the other hand, when the comparison result indicates that the pre-read data and the write data are the same ("YES" at step S330), the resistive memory device may terminate the write operation without writing the write data. At this time, since the threshold resistance of the target memory cell turned on during the pre-read operation of step S320 increases due to a drift phenomenon, the memory cells of a set state may change into a reset state. Therefore, before terminating the write operation, when the write data (i.e., the pre-read data) is in a set state ("SET" at step S350), it is necessary to heat-anneal the target memory cell (at step S360).

As mentioned above, the resistive memory device may minimize the power consumed during the write operations by selectively performing the write operation if the write data is the same as the pre-stored data in the memory cell. However, the write time required for the write operation has been increased due to the write latency by the pre-read and comparing operations in the selective write operation. In particular, for the memory cells of the set state, a separate heat-anneal process may lead to an even greater increase in overall write time.

Hereinafter, a selective write operation to reduce the write latency and power consumption in accordance with an embodiment of the proposed invention will be described.

Figure 4:
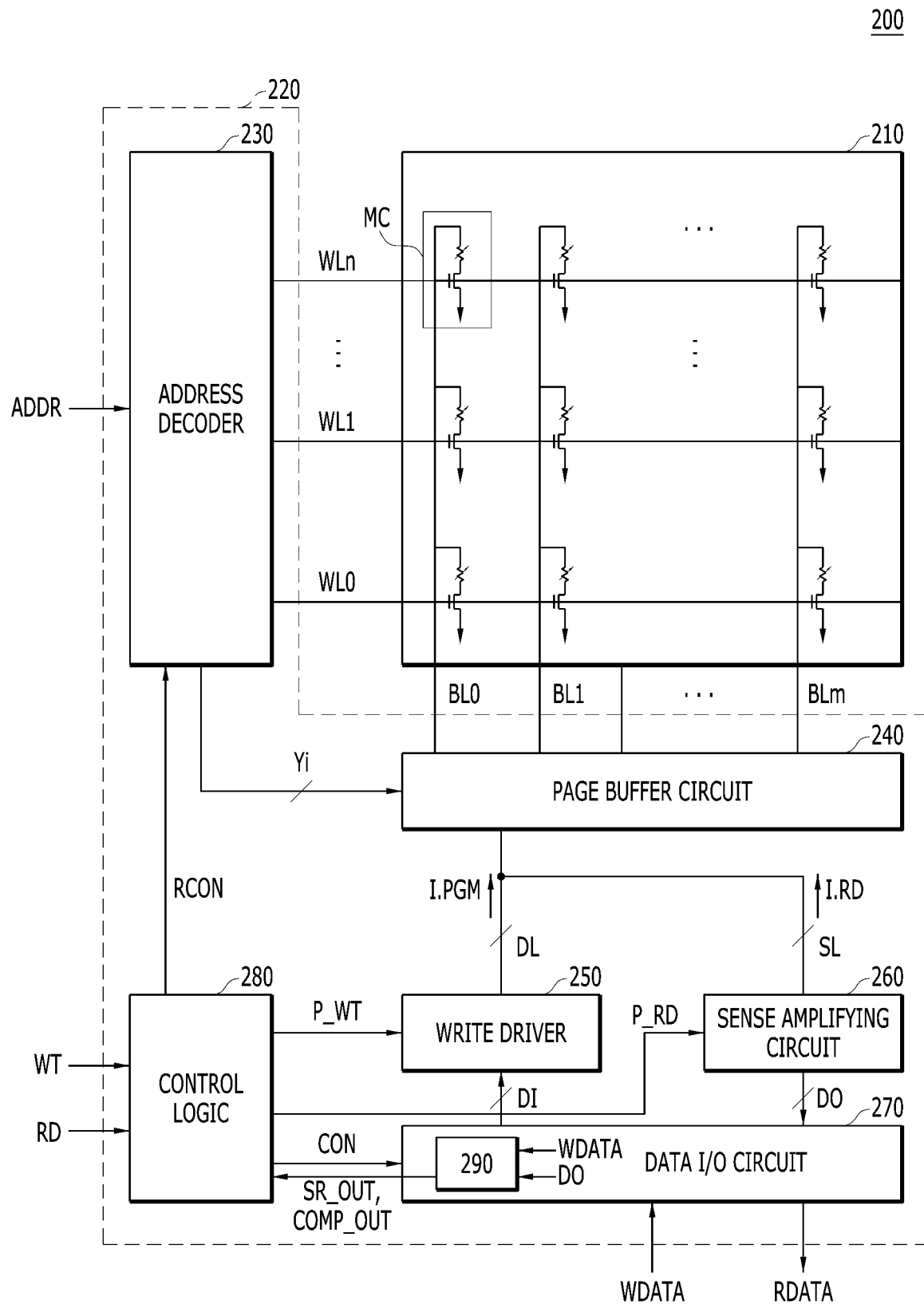
FIG. 4 is a block diagram illustrating a resistive memory device in accordance with an embodiment of the present invention.
Figure 5:
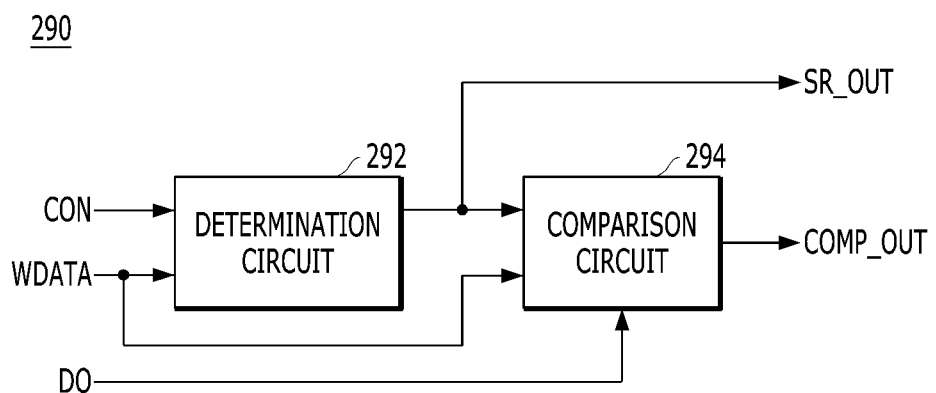
FIG. 5 is a detailed block diagram illustrating a write control circuit of FIG. 4.

FIG. 4 is a block diagram illustrating a resistive memory device 200 in accordance with an embodiment of the present invention. FIG. 5 is a detailed block diagram illustrating a write control circuit 290 of FIG. 4.

Referring to FIG. 4, the resistive memory device 200 may include a memory cell array 210 and a peripheral circuit 220.

The memory cell array 210 may include a plurality of memory cells MC. The peripheral circuit 220 may be coupled to the memory cells MC through a plurality of word lines WL0 to WLn and a plurality of bit lines BL0 to BLm. The memory cells MC of the memory cell array 210 may be disposed at intersection points of the word lines WL and the bit lines BL. The memory cells MC of the memory cell array 210 may include a phase-change material, which is described above with reference to FIGS. 1 and 2, and the memory device 200 may include a phase-change random access memory (PCRAM). Each of the memory cells MC may include a first state (i.e., a set state) in which the phase-change material has a crystalline state, and a second state (i.e., a reset state) in which the phase-change material has an amorphous state.

The peripheral circuit 220 may receive a write command WT, write data WDATA and an address ADDR from an external controller or test device (not shown), during a write operation. The peripheral circuit 220 may receive a read command RD and an address ADDR from the external controller or test device and output read data RDATA, during a read operation. According to an embodiment, the peripheral circuit 220 may determine whether the write data WDATA is in a set state or in a reset state. When the write data WDATA is in a set state, the peripheral circuit 220 may apply a first pulse (i.e., a set pulse) to a target memory cell corresponding to the address ADDR. When the write data WDATA is in a reset state, the peripheral circuit 220 may perform a pre-read operation to read out pre-stored data from the target memory cell, and selectively apply a second pulse (i.e., a reset pulse) to the target memory cell according to a comparison result of the pre-read data DO and the write data WDATA.

In detail, the peripheral circuit 220 may include an address decoder 230, a page buffer circuit 240, a write driver 250, a sense amplifying circuit 260, a data input/output (I/O) circuit 270, and a control logic 280.

The control logic 280 may control the address decoder 230, the page buffer circuit 240, the write driver 250, the sense amplifying circuit 260 and the data I/O circuit 270. In response to the write command WT and/or the read command RD, the control logic 280 may provide a row control signal RCON to the address decoder 230, a pulse control signal P_WT to the write driver 250, a sense control signal P_RD to the sense amplifying circuit 260, and an I/O control signal CON to the data I/O circuit 270.

The address decoder 230 may be coupled to the memory cell array 210 through the word lines WL0 to WLn. The address decoder 230 may provide a bias voltage to a selected word line by decoding the address ADDR in response to the row control signal RCON received from the control logic 280. Further, the address decoder 230 may generate a selection signal Yi for selecting the bit lines BL0 to BLm. The selection signal Yi may be provided to the page buffer circuit 240.

The page buffer circuit 240 may be coupled to the memory cell array 210 through the bit lines BL0 to BLm. The page buffer circuit 240 may select a bit line in response to the selection signal Yi provided from the address decoder 230. The page buffer circuit 240 may couple the bit line BL with a data line DL during the write operation, and couple the bit line BL with a sense line SL during the read operation, in response to the selection signal Yi.

The write driver 250 may provide a program pulse I_PGM to the data line DL in response to the pulse control signal P_WT and input data DI. The program pulse I_PGM may include a set pulse, a reset pulse or biases for a pre-select operation.

The sense amplifying circuit 260 may sense a difference between a voltage of the sense line SL and a reference voltage VREF in response to the sense control signal P_RD, and may read out data stored in the target memory cell and provide the data as output data DO (or the pre-read data DO). The reference voltage VREF may be supplied from a reference voltage generation circuit (not shown).

The data I/O circuit 270 may receive the write data WDATA and provide it as the input data DI, or output the output data DO provided from the sense amplifying circuit 260 as the read data RDATA to the controller or test device, in response to the I/O control signal CON.

According to an embodiment, the data I/O circuit 270 may include the write control circuit 290. The write control circuit 290 may be activated during the write operation, in response to the I/O control signal CON. During the write operation, the write control circuit 290 may determine whether the write data WDATA is in a set state or in a reset state to output a determination signal SR_OUT. Further, the write control circuit 290 may compare the pre-read data DO with the write data WDATA in response to the determination signal SR_OUT to output a comparison signal COMP_OUT.

Referring to FIG. 5, the write control circuit 290 may include a determination circuit 292 and a comparison circuit 294. The determination circuit 292 may be activated during the write operation in response to the I/O control signal CON. The determination circuit 292 may determine whether the write data WDATA is in a set state or in a reset state. The determination circuit 292 may enable the determination signal SR_OUT to a logic high level when the write data WDATA is in the set state, and disable the determination signal SR_OUT to a logic low level when the write data WDATA is in the reset state. When the determination signal SR_OUT is disabled to a logic low level, the comparison circuit 294 may compare the pre-read data DO acquired through the pre-read operation, with the write data WDATA to output the comparison signal COMP_OUT. The comparison circuit 294 may generate the comparison signal COMP_OUT at a logic high level when the pre-read data DO and the write data WDATA are the same.

Referring back to FIG. 4, the control logic 280 may generate the pulse control signal P_WT and the sense control signal P_RD according to the determination signal SR_OUT and the comparison signal COMP_OUT when the write command WT is inputted during a write operation. For example, if the determination signal SR_OUT is enabled, the control logic 280 may generate the pulse control signal P_WT to apply a set pulse to the target memory cell. If the determination signal SR_OUT is disabled, the control logic 280 may generate the sense control signal P_RD to read out the pre-read data DO from the target memory cell. Then, the control logic 280 may generate the pulse control signal P_WT to selectively apply a reset pulse to the target memory cell according to the comparison signal COMP_OUT. For example, if the comparison signal COMP_OUT is at a logic high level, the control logic 280 may not generate the pulse control signal P_WT to prevent the write driver 250 from performing the write operation. If the comparison signal COMP_OUT is at a logic low level, the control logic 280 may generate the pulse control signal P_WT to apply a reset pulse to the target memory cell.

Meanwhile, the peripheral circuit 220 may perform a pre-select operation that applies a bias to the word line and the bit line associated with the target memory cell, before applying a set pulse or reset pulse to the memory cell array 210. During the pre-select operation, the control logic 280 may control the address decoder 230 and the write driver 250 to select the target memory cell by applying a bias to the word line and the bit line selected according to the address ADDR. The control logic 280 may control the address decoder 230 and the write driver 250 such that adjacent memory cells located on the same bit line or on the same word line as the target memory cell are not selected, while applying a bias to the selected word line and the selected bit line. For example, the control logic 280 may control the address decoder 230 and the write driver 250 to apply a certain bias to the selected word line and the selected bit line, and to apply a ground voltage (VSS) to the remaining non-selected bit lines and non-selected word lines. After that, if the target memory cell is not turned on, the control logic 280 may increase the bias applied to the selected bit line while applying a bias higher than the ground voltage (VSS) to the remaining non-selected word lines, preventing memory cells located on the same bit line from turning on.

Although FIG. 4 shows the write control circuit 290 disposed within the data I/O circuit 270, the proposed invention is not limited thereto. That is, in an embodiment, the write control circuit 290 may be located outside the data I/O circuit 270. For example, in an embodiment, the write control circuit may be disposed within the control logic 280.

Hereinafter, an operation of a resistive memory device in accordance with an embodiment of the present invention will be described with reference to FIGS. 4 to 6.

Figure 6:
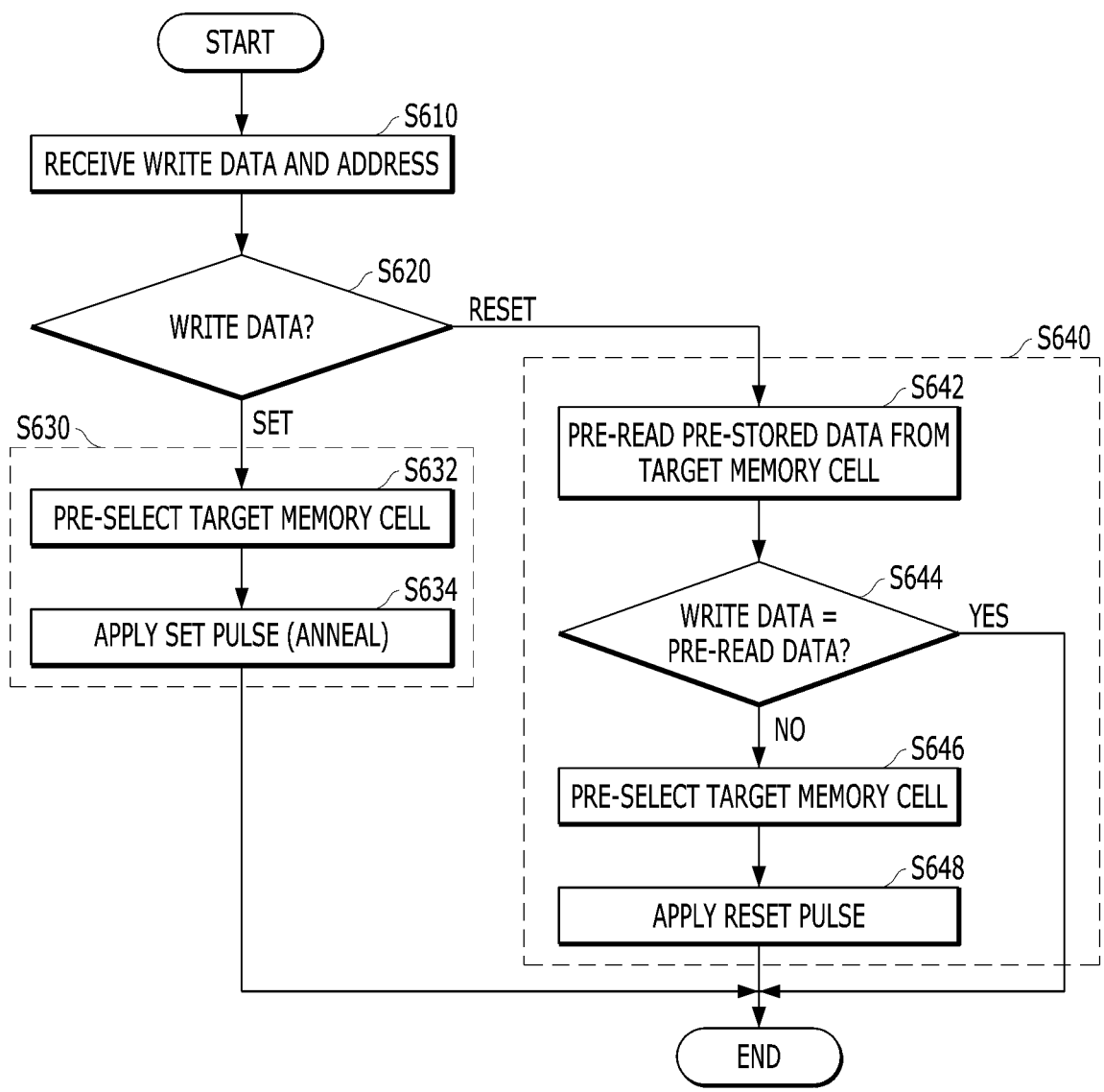
FIG. 6 is a flow chart for describing a selective write operation of a resistive memory device in accordance with an embodiment of the present invention.

FIG. 6 is a flow chart for describing a selective write operation of a resistive memory device in accordance with an embodiment of the present invention.

Referring to FIG. 6, the peripheral circuit 220 of the resistive memory device 200 receives a write command WT, an address ADDR for designating a target memory cell, and write data WDATA to be written in the target memory cell from a controller or test device (at step S610). In detail, the control logic 280 provides a row control signal RCON to the address decoder 230, and an I/O control signal CON to the data I/O circuit 270, in response to the write command WT. In response to the I/O control signal CON, the data I/O circuit 270 receives the write data WDATA and provides it as input data DI. In response to the row control signal RCON, the address decoder 230 selects a word line by decoding the address ADDR, and generates a selection signal Yi for selecting a bit line. The page buffer circuit 240 selects the bit line in response to the selection signal Yi. The target memory cell may be disposed at intersection points of the selected word line and the selected bit line.

The write control circuit 290 determines whether the write data WDATA is in a set state or in a reset state in response to the I/O control signal CON (at step S620).

When the write data WDATA is in the set state ("SET" at step S620), the peripheral circuit 220 writes the write data WDATA of the set state into the target memory cell (at step S630). In detail, the write control circuit 290 enables a determination signal SR_OUT to a logic high level, and the control logic 280 generates a pulse control signal P_WT according to the determination signal SR_OUT. As a result, the write driver 250 applies a set pulse as a program pulse I_PGM to a data line DL according to the input data DI and the pulse control signal P_WT. The set pulse applied to the data line DL may be written into the target memory cell through the selected bit line (at step S634). At this time, according to the embodiment, since the set pulse is applied, no additional heat-anneal process needs to be performed.

Meanwhile, before applying the set pulse at step S634, the peripheral circuit 220 may perform a pre-select operation (at step S632) to pre-select the target memory cell by applying a bias to the selected word line and the selected bit line. For example, the control logic 280 provides the row control signal RCON to the address decoder 230 in order to apply a bias to the selected word line, and provides the pulse control signal P_WT to the write driver 250 in order to apply a bias to the selected bit line. At this time, the control logic 280 controls the address decoder 230 and the write driver 250 such that a certain bias is applied to the selected word line and the selected bit line, while applying a ground voltage (VSS) to the remaining non-selected bit lines and non-selected word lines. After that, if the target memory cell is not turned on, the control logic 280 increases the bias applied to the selected bit line, while applying a bias higher than the ground voltage (VSS) to the remaining non-selected word lines, preventing memory cells located on the same bit line from turning on.

Meanwhile, when the write data WDATA is in the reset state ("RESET" at step S620), the peripheral circuit 220 selectively writes the write data WDATA of the reset state into the target memory cell (at step S640).

The peripheral circuit 220 performs a pre-read operation to read out pre-stored data from the target memory cell (at step S642). In detail, the write control circuit 290 disables the determination signal SR_OUT to a logic low level, and the control logic 280 generates a sense control signal P_RD according to the determination signal SR_OUT. The sense amplifying circuit 260 reads out pre-read data DO from the target memory cell in response to the sense control signal P_RD, and then the write control circuit 290 compares the pre-read data DO with the write data WDATA to output a comparison signal COMP_OUT (at step S644). At this time, the write data WDATA and the pre-read data DO may be compared. In an embodiment, the write data WDATA and the pre-read data DO may be compared bit by bit.

When the pre-read data DO and the write data WDATA are the same so that the comparison signal COMP_OUT transitions to a logic high level ("YES" at step S644), the control logic 280 does not generate the pulse control signal P_WT and the write operation is terminated.

When the pre-read data DO and the write data WDATA are different from each other so that the comparison signal COMP_OUT transitions to a logic low level ("NO" at step S644), the control logic 280 generates and provides the pulse control signal P_WT to the write driver 250. The write driver 250 applies a reset pulse as the program pulse I_PGM to the data line DL according to the input data DI and the pulse control signal P_WT. The reset pulse applied to the data line DL may be written into the target memory cell through the selected bit line (at step S648).

Meanwhile, before applying the reset pulse at step S648, the peripheral circuit 220 may perform a pre-select operation (at step S646) to pre-select the target memory cell by applying a bias to the selected word line and the selected bit line. Likewise, the control logic 280 controls the address decoder 230 and the write driver 250 such that a certain bias is applied to the selected word line and the selected bit line, while applying a ground voltage (VSS) to the remaining non-selected bit lines and non-selected word lines. After that, if the target memory cell is not turned on, the control logic 280 increases the bias applied to the selected bit line, while applying a bias higher than the ground voltage (VSS) to the remaining non-selected word lines, preventing memory cells located on the same bit line from turning on.

FIG. 7 is a comparative table for comparing a conventional selective write operation to a selective write operation in accordance with an embodiment of the present invention.

Referring to FIG. 7, when the write data WDATA is in a set state, and the pre-read data DO is in a reset state (CASE 1), a pre-read operation (step S320 of FIG. 3), a pre-select operation (step S342 of FIG. 3) and a set pulse applying operation (step S347 of FIG. 3) are sequentially performed, in accordance with the conventional selective write operation. On the contrary, in CASE 1, a pre-select operation (step S632 of FIG. 6) and a set pulse applying operation (step S634 of FIG. 6) are sequentially performed in accordance with the selective write operation of the present invention.

In a case where both of the write data WDATA and the pre-read data DO are in a reset state (CASE 2), a pre-read operation (step S320 of FIG. 3, or step S642 of FIG. 6) is performed for both the conventional selective write operation and the selective write operation of the present invention.

In a case where both of the write data WDATA and the pre-read data DO are in a set state (CASE 3), a pre-read operation (step S320 of FIG. 3) and a heat-anneal operation (step S360 of FIG. 3) are sequentially performed, in accordance with the conventional selective write operation. On the contrary, in CASE 3, a pre-select operation (step S632 of FIG. 6) and a set pulse applying operation (step S634 of FIG. 6) are sequentially performed in accordance with the selective write operation of the present invention.

In a case where the write data WDATA is in a reset state, and the pre-read data DO is in a set state (CASE 4), a pre-read operation (step S320 of FIG. 3, or step S642 of FIG. 6), a pre-select operation (step S342 of FIG. 3, or step S646 of FIG. 6) and a reset pulse applying operation (step S346 of FIG. 3, or step S648 of FIG. 6) are sequentially performed for both the conventional selective write operation and the selective write operation of the present invention.

As is apparent from the above descriptions, the resistive memory device in accordance with the embodiments of the present invention may skip or omit a pre-read operation by performing a pulse applying operation regardless of the value of the pre-read data DO when the write data WDATA is in a set state. Therefore, the write latency due to the pre-read operation may be reduced/minimized and power consumption due to the pre-read operation may be reduced/minimized. In particular, by skipping or omitting a separate annealing process that is performed on the data of a set state after the pre-read operation in the conventional selective write operation, the write latency may further reduced/minimized.

In addition, a plurality of cell matrices are placed in a memory cell array of a resistive memory device and 128 bits of write data are written for each mat during a single write operation. In a selective write operation in accordance with the embodiment of the present invention, a pre-select operation (step S632 of FIG. 6) when the write data is in a set state may be performed at the same time as a pre-read operation (step S642 of FIG. 6) when the write data is in a reset state. Therefore, the write latency may be significantly reduced.

Figure 8:
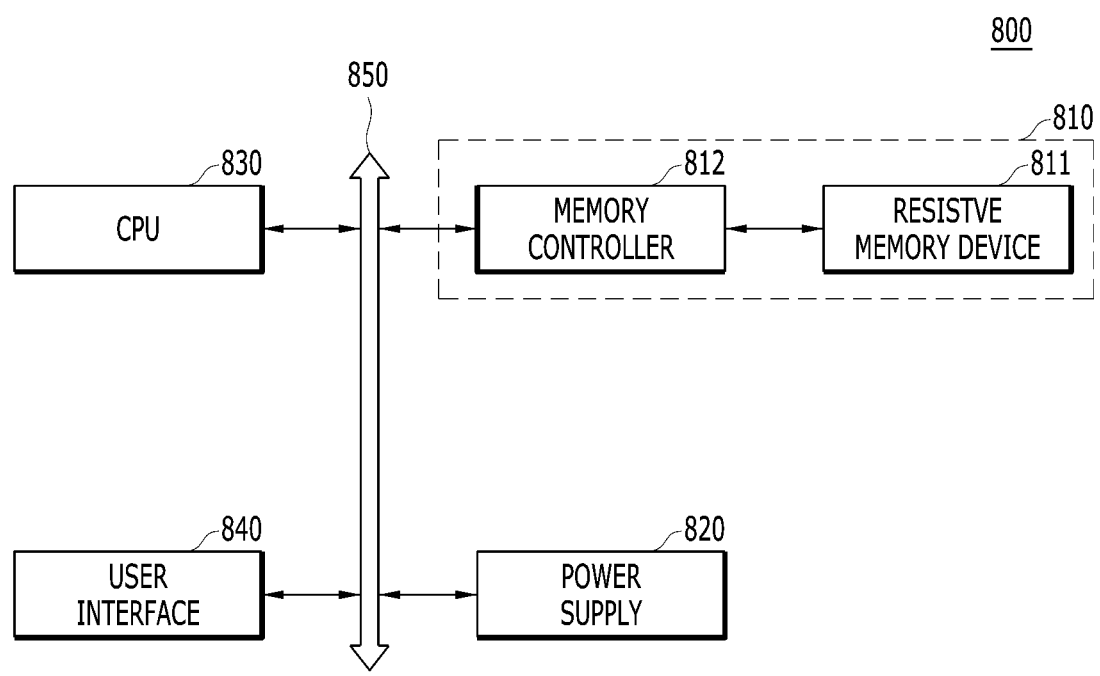
FIG. 8 is a block diagram illustrating a computing system including a resistive memory device in accordance with an embodiment of the present invention.

FIG. 8 is a block diagram illustrating a computing system 800 including a resistive memory device in accordance with an embodiment of the present invention.

Referring to FIG. 8, the computing system 800 may include a memory system 810 including a resistive memory device 811 and a memory controller 812, a central processing unit (CPU) 830 electrically connected to a system bus 850, a user interface 840, and a power supply device 820.

Data, which is provided through the user interface 840 or processed by the CPU 830, may be stored in the resistive memory device 811 through the memory controller 812.

The resistive memory device 811 may include a plurality of memory cells. According to an embodiment, the memory controller 812 may provide a write command, an address for designating a target memory cell among the plurality of memory cells, and write data to be written in the target memory cell to the resistive memory device 811, during a write operation. The resistive memory device 811 shown in FIG. 8 may be implemented with the configuration and operation of the resistive memory device shown in FIGS. 4 to 6. That is, the resistive memory device 811 may determine whether the write data is in a set state or in a reset state. When the write data is in a set state, the resistive memory device 811 may apply a first pulse (i.e., a set pulse) to a target memory cell corresponding to the address. When the write data is in a reset state, the resistive memory device 811 may perform a pre-read operation to read out pre-stored data from the target memory cell, and selectively apply a second pulse (i.e., a reset pulse) to the target memory cell according to a comparison result of pre-read data and the write data.

Although not illustrated in the drawing, a camera image processor (CIS), a mobile DRAM and the like may be further embodied with the computing system.

As is apparent from the above descriptions, the resistive memory device in accordance with the embodiments of the present invention may reduce the write latency and reduce power consumption by omitting an unnecessary pre-read operation during a selective write operation.

While the present invention has been described with respect to specific embodiments, the embodiments are not intended to be restrictive, but rather descriptive. Further, it is noted that the present invention may be achieved in various other ways through substitution, change, and modification of various features of the described embodiments, by those skilled in the art without departing from the spirit and/or scope of the present invention as defined by the following claims.

What is claimed is:

1. An operation method of a resistive memory device, comprising:
   receiving write data and an address;
   determining whether the write data is in a first state or in a second state;
   applying a first pulse to a target memory cell corresponding to the address, among a plurality of memory cells, when the write data is in the first state; and
   selectively applying, when the write data is in the second state, a second pulse to the target memory cell according to a comparison result of the write data and pre-read data which is pre-stored data read from the target memory cell.

2. The operation method of claim 1,
   wherein the memory cells include a phase-change material, and
   wherein each of the memory cells includes the first state in which the phase-change material has a crystalline state, and the second state in which the phase-change material has an amorphous state.

3. The operation method of claim 1, further comprising performing, before applying the first pulse to the target memory cell, a pre-select operation of applying a bias to a selected word line and a selected bit line according to the address, to pre-select the target memory cell.

4. The operation method of claim 3, wherein the pre-select operation includes:
   applying a bias to the selected word line and the selected bit line while applying a ground voltage to remaining non-selected bit lines and non-selected word lines; and
   increasing the bias applied to the selected bit line while applying a bias higher than the ground voltage to the remaining non-selected word lines.

5. The operation method of claim 1, wherein the selectively applying the second pulse to the target memory cell includes:
   skipping applying the second pulse when the pre-read data and the write data are the same.

6. The operation method of claim 1, wherein the selectively applying the second pulse to the target memory cell includes:
   performing a pre-select operation of applying a bias to a selected word line and a selected bit line according to the address to pre-select the target memory cell when the pre-read data and the write data are different from each other; and
   applying the second pulse to the target memory cell when the pre-read data and the write data are different from each other.

7. The operation method of claim 6, wherein the pre-select operation includes:
   applying a bias to the selected word line and the selected bit line while applying a ground voltage to remaining non-selected bit lines and non-selected word lines; and
   increasing the bias applied to the selected bit line while applying a bias higher than the ground voltage to the remaining non-selected word lines.

8. A resistive memory device, comprising:
   a memory cell array including a plurality of memory cells; and
   a peripheral circuit suitable for
      determining whether write data is in a first state or in a second state,
      applying a first pulse to a target memory cell corresponding to an address, among the memory cells, when the write data is in the first state, and
      selectively applying, when the write data is in the second state, a second pulse to the target memory cell according to a comparison result of the write data and pre-read data which is pre-stored data read from the target memory cell.

9. The resistive memory device of claim 8,
   wherein the memory cells include a phase-change material, and
   wherein each of the memory cells includes the first state in which the phase-change material has a crystalline state, and the second state in which the phase-change material has an amorphous state.

10. The resistive memory device of claim 8, wherein the peripheral circuit includes:
   a write driver suitable for applying the first pulse or the second pulse to the target memory cell according to a pulse control signal and the write data;
   a sense amplifying circuit suitable for reading out data pre-stored in the target memory cell according to a sense control signal, and providing the data as the pre-read data;
   a write control circuit suitable for determining whether the write data is in the first state or the second state to output a determination signal, and for comparing the pre-read data with the write data according to the determination signal to output the comparison signal; and
   a control logic suitable for generating the pulse control signal and the sense control signal according to the determination signal and the comparison signal.

11. The resistive memory device of claim 10, wherein the write control circuit includes:
   a determination circuit suitable for enabling the determination signal when the write data is in the first state; and
   a comparison circuit suitable for generating the comparison signal by comparing the pre-read data with the write data when the determination signal is disabled.

12. The resistive memory device of claim 10,
   wherein the control logic generates the pulse control signal to apply the first pulse to the target memory cell when the determination signal is enabled, and
   wherein the control logic generates the sense control signal to read out the pre-read data from the target memory cell and generates the pulse control signal to selectively apply the second pulse to the target memory cell according to the comparison signal, when the determination signal is disabled.

13. The resistive memory device of claim 8, wherein the peripheral circuit performs, before applying the first pulse or the second pulse to the target memory cell, a pre-select operation of applying a bias to a selected word line and a selected bit line according to the address to pre-select the target memory cell.

14. The resistive memory device of claim 13, wherein the peripheral circuit performs the pre-select operation
   by applying a bias to the selected word line and the selected bit line while applying a ground voltage to remaining non-selected bit lines and non-selected word lines, and
   by increasing the bias applied to the selected bit line while applying a bias higher than the ground voltage to the remaining non-selected word lines.

15. The resistive memory device of claim 8, wherein the peripheral circuit selectively applies the second pulse by:
   skipping applying the second pulse to the target memory cell when the pre-read data and the write data are the same, or
   applying the second pulse to the target memory cell when the pre-read data and the write data are different from each other.

16. A memory system, comprising:
   a controller suitable for providing write data and an address; and
   a resistive memory device including a plurality of memory cells and suitable for
   determining whether the write data is in a first state or in a second state,
   applying a first pulse to a target memory cell corresponding to the address when the write data is in the first state, and
   selectively applying, when the write data is in the second state, a second pulse to the target memory cell according to a comparison result of the write data and pre-read data which is pre-stored data read from the target memory cell.

17. The memory system of claim 16,
   wherein the memory cells include a phase-change material, and
   wherein each of the memory cells includes the first state in which the phase-change material has a crystalline state, and the second state in which the phase-change material has an amorphous state.

18. The memory system of claim 16, wherein the resistive memory device performs, before applying the first pulse or the second pulse to the target memory cell, a pre-select operation of applying a bias to a selected word line and a selected bit line according to the address to pre-select the target memory cell.

19. The memory system of claim 18, wherein the resistive memory device performs the pre-select operation
   by applying a bias to the selected word line and the selected bit line while applying a ground voltage to remaining non-selected bit lines and non-selected word lines, and
   by increasing the bias applied to the selected bit line while applying a bias higher than the ground voltage to the remaining non-selected word lines.

20. The memory system of claim 15, wherein the resistive memory device selectively applies the second pulse by:
   skipping applying the second pulse to the target memory cell when the pre-read data and the write data are the same, or
   applying the second pulse to the target memory cell when the pre-read data and the write data are different from each other.

21. An operating method of a resistive memory device, the operating method comprising:
   applying, when the write data is in a set state, a set pulse to a target memory cell;
   comparing, when the write data is in a reset state, the write data with pre-read data of the target memory cell; and
   applying a reset pulse to the target memory cell when a result of the comparison indicates that the pre-read data is in the set state.

* * * * *